(12) United States Patent
Stephenson

(10) Patent No.: US 6,262,697 B1
(45) Date of Patent: *Jul. 17, 2001

(54) DISPLAY HAVING VIEWABLE AND CONDUCTIVE IMAGES

(75) Inventor: Stanley W. Stephenson, Spencerport, NY (US)

(73) Assignee: Eastman Kodak Company, Rochester, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/045,016

(22) Filed: Mar. 20, 1998

(51) Int. Cl.⁷ ........................................................ G09G 3/04
(52) U.S. Cl. .............................. 345/43; 345/50; 349/139; 430/20; 430/416
(58) Field of Search ........................... 349/42, 106, 122, 349/86, 139; 345/38, 45, 92, 87, 169.3, 205, 43, 50; 355/32, 77; 430/311, 416, 20

(56) References Cited

U.S. PATENT DOCUMENTS

| 4,435,047 |   | 3/1984  | Fergason .        |         |
|-----------|---|---------|-------------------|---------|
| 4,670,097 | * | 6/1987  | Abdalla et al.    | 216/13  |
| 5,049,480 | * | 9/1991  | Nebe et al.       | 430/281.1 |
| 5,384,618 | * | 1/1995  | Schurman et al.   | 355/32  |
| 5,396,304 | * | 3/1995  | Salerno et al.    | 353/122 |
| 5,444,557 | * | 8/1995  | Spitzer et al.    | 359/59  |
| 5,462,822 | * | 10/1995 | Roosen et al.     | 430/7   |
| 5,508,134 | * | 4/1996  | Shirai            | 430/20  |
| 5,561,030 | * | 10/1996 | Holdcroft et al.  | 430/311 |
| 5,754,268 | * | 5/1998  | Aihara et al.     | 349/155 |
| 5,976,284 | * | 11/1999 | Calvert et al.    | 156/51  |

* cited by examiner

Primary Examiner—Steven Saras
Assistant Examiner—Uchendu O. Anyaso
(74) Attorney, Agent, or Firm—Raymond L. Owens

(57) ABSTRACT

A display for presenting selected images to a viewer is disclosed, including a transparent substrate, a transparent, electrically conductive coating formed over the transparent substrate, a light modulating layer formed over the transparent, electrically conductive layer and a photosensitive layer formed over the light modulating layer which is adapted to be exposed and developed to provide viewable and conductive images. The display further includes the light modulated layer being effective in two conditions, in a first condition to prevent the viewing of the viewable and conductive images and in a second condition to permit the viewing of the viewable and conductive images, and an electrical conduction structure connected to the viewable and conductive images and the transparent, electrically conductive coating for applying a field to the selected ones of such viewable and conductive images to cause the light modulating layer to change from the first condition to the second condition so as to present such viewable and conductive images to the viewer.

16 Claims, 5 Drawing Sheets

DISPLAY HAVING VIEWABLE AND CONDUCTIVE IMAGES

CROSS REFERENCE TO RELATED APPLICATIONS

Reference is made to commonly-assigned U.S. patent application Ser. No. 08/961,059 filed Oct. 30, 1997, entitled "Display Apparatus Using Light Patternable Conductive Traces" by Stanley W. Stephenson; commonly-assigned U.S. patent application Ser. No. 08/961,056 filed Oct. 30, 1997, entitled "Single Sheet Display Having Patternable Conductive Traces" by Stanley W. Stephenson; commonly-assigned U.S. patent application Ser. No. 08/990,891 filed Dec. 15, 1997, entitled "Method of Producing a Display Having Patternable Conductive Traces" by Stanley W. Stephenson; commonly-assigned U.S. patent application Ser. No. 08/990,853 filed Dec. 15, 1997, entitled "A Sheet Having Patternable Conductive Traces for Use in a Display" by Stanley W. Stephenson; and commonly-assigned U.S. patent application Ser. No. 09/027,321 filed Feb. 20, 1998, entitled "Selectively Presenting Viewable and Conductive Images" by Stanley W. Stephenson, the disclosures of which are incorporated herein by reference.

FIELD OF THE INVENTION

The field of invention relates to displays in which images can be selectively presented to a viewer.

BACKGROUND OF THE INVENTION

Flat panel displays can be fabricated using many techniques. Typical embodiments are disclosed in *Liquid Crystal Flat Panel Displays* by William C. O'Mara (Chapman & Hall, New York, N.Y. 1993) and other similar publications. These displays use transparent glass plates as substrates, and electrical traces are sputtered in a pattern of parallel lines that form a first set of conductive traces. A transparent conductor such as Indium Tin Oxide (ITO) is sputtered over the traces to disperse an electrical charge across transparent areas not blocked by the traces. A second substrate is similarly coated with a set of traces having a transparent conductive layer.

Layers are applied over the substrates and patterned to orient liquid crystals in twisted nematic (TN) or super-twisted-nematic (STN) configurations. The two substrates are spaced apart and the space between the two substrates is filled with a liquid crystal material. Pairs of conductors from either set are selected and energized to alter the optical transmission properties of the liquid crystal material.

In another embodiment, the traces do not define an orthogonal grid, but are organized to form alpha-numeric displays or graphic images. In a further embodiment, an active display on a transparent substrate is sputtered or printed and uses memory elements to continuously drive each display element depending on information written to the memory element. In another embodiment, disclosed in SID DIGEST 90, article 12.6, the liquid crystal material can be polymerically dispersed to form a Liquid Crystal Polymer Matrix (LCPC). LCPCs are typically disposed in ultra-violet polymerized acrylic polymers. The liquid crystals are homogenized into the polymer, and the emulsion is coated onto a substrate. Ultra violet light is applied to the emulsion. The emulsion hardens, and bubbles of liquid crystal material are held in a rigid polymeric matrix.

Reflective liquid crystal polymer matrix displays are disclosed in U.S. Pat. No. 4,435,047. A first sheet has transparent ITO conductive areas and a second sheet has electrically conductive inks printed on display areas. The sheets can be glass, but in practice have been formed of Mylar polyester. A dispersion of liquid crystal material in a binder is coated on the first sheet, and the second sheet is pressed onto the liquid crystal material. Electrical charges applied to opposing conductive areas operate on the liquid crystal material to expose display areas. Pleichroic dyes are added to the liquid crystal to cause the liquid crystal material to act as a shutter over the printed areas. The technology from this and related patents was licensed to the Taliq Corporation of Sunnyvale, Calif. Currently, Taliq products form electrical interconnection by offsetting the two sheets and contacting trace conductors from each of the two sheets.

Image displays can provide color images if a color filter array is formed over the pixels of the display. In U.S. Pat. No. 5,462,822, three color layers are formed on a transparent substrate. In this patent, a transparent electrode layer is formed over the color filter. The filter plate is aligned onto a liquid crystal layer. The plate is glass and has silver halide, color-forming layers. A transparent electrode material is sputtered at high temperature over the color filter array. In practice, the presence of the transparent electrode material causes ionic migration of the dyes in the dye layers. It would be advantageous to separate the electrically conductive layer from the dye layers.

The prior art requires multiple, separate layers on multiple plates to build up the display. The electrical traces and transparent conductive layers are typically formed through repeated vacuum deposition of materials on the substrate. These processes are expensive and require long processing times on capital intensive equipment Because most display structures are formed of glass, two sheets are used and are offset to permit connection to two separate and exposed sets of traces that are disposed on separate sheets. It would advantageous to lower the cost of flat panel displays. Additionally, current structures are not amenable to the creation of low-cost large flat panel displays. It would be advantageous to be able to form low-cost, large flat-panel displays.

A simple means is required to form electrical interconnection with both layers of traces. Prior art teaches isolating each layer on separate sides of the display, and connecting the traces to drive electronics using solder connections, wire bonds or pressure contact. Such connections do require that both sets of traces be exposed on a surface for the connection process. The uniform, multilayer structure prevents connection to the inner conductive layer.

SUMMARY OF THE INVENTION

Accordingly, it is an object of the present invention to permit light formable display areas on a display sheet having multiple uniform coatings.

This object is achieved by a display for presenting selected images to a viewer, comprising:

(a) a transparent substrate;

(b) a transparent, electrically conductive coating formed over the transparent substrate;

(c) a light modulating layer formed over the transparent, electrically conductive layer, (d) a photosensitive layer formed over the light modulating layer which is adapted to be exposed and developed to provide viewable and conductive images;

(e) the light modulating layer being effective in two conditions, in a first condition to prevent the viewing of the viewable and conductive images and in a second condition to permit the viewing of the viewable and conductive images; and (f) electrical conduction means connected to the viewable and conductive images and the transparent, electrically conductive coating for applying a field to selected ones of such viewable and conductive images to cause the light modulating layer to change from the first condition to the second condition so as to present such viewable and conductive images for viewing to the viewer.

ADVANTAGES

The disclosed structure has the advantage of providing a reflective display using light sensitive, conductor forming coatings over a liquid crystal, light modulating layer. The liquid crystal material and light sensitive conductor forming material is inexpensive when coated simultaneously using current photographic coating technology. The sheet can be formed using inexpensive, fast photographic means to expose and develop a display. A single large volume of sheet material can be coated and formed into different types of displays by exposing the light sensitive material to different patterns.

DETAILED DESCRIPTION OF THE INVENTION

Figure 1A:
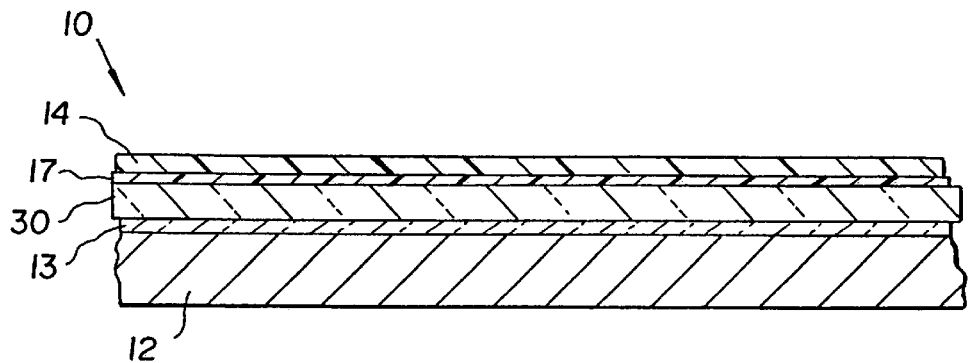
FIG. 1A is a sectional view of an unprocessed sheet used to form a display in accordance with the present invention.

A sectional view of an unprocessed sheet 10 used in the invention is shown in FIG. 1A. The sheet 10 includes a substrate 12. Substrate 12 can be made of a transparent polymeric material, such as Kodak Estar film base formed of polyester plastic, and have a thickness of between 20 and 200 microns. In an exemplary embodiment, substrate 12 can be a 80 micron thick sheet of polyester film base. Other polymers, such as transparent polycarbonate, can also be used. An optically transparent, electrically conductive coating 13 is formed over the substrate 12. The transparent, electrically conductive coating 13 can be formed of tin-oxide or Indium-Tin-Oxide (ITO), with ITO being the preferred material. Typically, the transparent, electrically conductive coating 13 is sputtered onto the substrate 12 to a resistance of less than 250 ohms per square.

A light modulating layer 30 is formed over the transparent, electrically conductive coating 13. Light modulating layer 30 can be a liquid crystal of conventional design. The selected material should exhibit high optical and electrical anisotropy and match the index of refraction of the carrier polymer when the material is electrically oriented. Examples of such materials are Merck MLC-6406, MLC-6422, MLC 6436-000, 6436-100, 9300-100. In one embodiment, a liquid crystal material is homogenized in a polymeric binder such as de-ionized gelatin or polyvinyl alcohol (PVA). Such compounds are machine coatable on equipment associated with photographic films. It is important that the binder have a low ionic content. The presence of ions in such a binder hinders the development of an electrical field across the dispersed liquid crystal material. Additionally, ions in the binder can migrate in the presence of an electrical field, chemically damaging the light modulating layer 30. Light modulating layer 30 must be formed of materials that permit penetration by an electrical conductor. The liquid crystal and gelatin emulsion is coated to a thickness of between 1 and 30 microns to optimize light modulating of light modulating layer 30. The coating thickness, size of the liquid crystal bubbles and concentration of the bubbles of liquid crystal materials is designed to diffuse and reflect light. Other light reflecting or diffusing modulating, electrically operated materials can also be coated such as a micro-encapsulated ferroelectric (FLC) material. The light modulating layer 30 is effective in two conditions, which will be described in more detail below.

A barrier layer 17 is coated over light modulating layer 30. Barrier layer 17 protects light modulating layer 30 from processing chemicals used on sheet 10. Barrier layer can be a layer of de-ionized gelatin or PVA that has been polymerized to resist ionic diffusion into light modulating layer 30. A photosensitive layer 14 is coated over barrier layer 17. The photosensitive layer 17 forms metal deposits of conductivity sufficient to carry a charge to operate on the light modulating layer 30, and is preferably an emulsion of silver halide grains. After exposure and devlopment, the silver halide is substantially converted to metallic silver. Alternatively, other photosensitive materials can be used, such as gold or copper salts. In the case of silver halide emulsions, high concentrations of crystalline silver halide in a binder, such as gelatin or PVA, are used to improve conductivity over conventional imaging emulsions. Conductive additives such as fine Indium-Tin-Oxide or fine silver with particle sizes between 0.5 and 2 microns can be added to the emulsion to improve conductivity of photographically produced metallic silver.

Figure 1B:
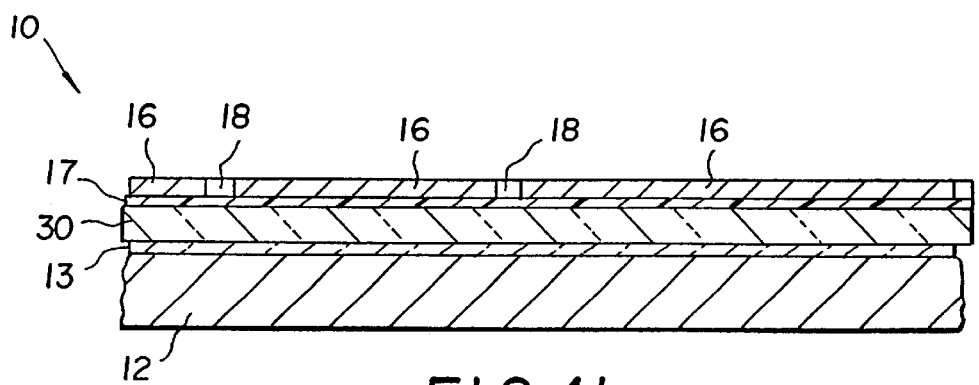
FIG. 1B is a sectional view of the sheet of FIG. 1A after processing.

FIG. 1B is a sectional view through the sheet 10 after processing. The photosensitive layer 14 is exposed and developed to create viewable and conductive images 16 and non-conductive areas 18, as shown in FIG. 1B. When silver halide grains in gelatin are used for the photosensitive layer 14, the viewable and conductive images 16 are metallic silver formed from exposed silver halide grains in the unprocessed sheet 10. The effective sheet conductivity of the viewable and conductive images 16 is less than 250 ohms per square. Viewable and conductive images 16 appear black, having an optical density of greater than 2.0 D. Unexposed silver halide in non-conductive areas 18 has been removed by conventional photographic processes to define the extent of viewable and conductive images 16. Non-conductive areas 18 are typically gaps in developed silver approximately 5–50 microns wide that electrically isolate electrically viewable and conductive images 16.

Figure 1C:
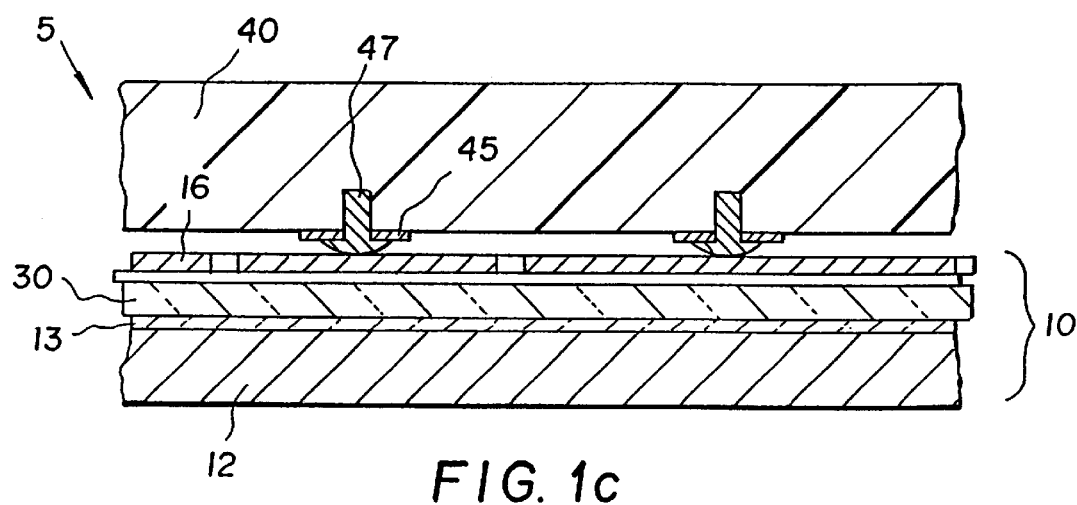
FIG. 1C is a sectional view of the sheet of FIG. 1A connected to a circuit board to form the display in accordance with the present invention.

The transparent, electrically conductive coating 13 provides a continuous electrode across light modulating layer 30. An electrical field across viewable and conductive images 16 and transparent, electrically conductive coating 13 operates on light modulating layer 30 to permit absorption of light in viewable and conductive images 16. FIG. 1C is a section view of processed sheet 10 connected to circuit board 40 to form a display 5. Circuit board 40 has a series of conductive traces 45 that are connected to viewable and conductive images 16 through contact pads 47. External control circuitry of conventional design (not shown) selectively grounds viewable and conductive images 16 to activate segments of display 5. Thus, the light modulating layer 30 is effective in two conditions. In a first condition, the light modulating layer 30 prevents the viewing of the viewable and conductive images 16, and in a second condition, the light modulating layer 30 permits the viewing of the viewable and conductive images 16.

An alternating voltage is applied to transparent, electrically conductive coating 13 to provide an electrical field across viewable and conductive images 16 that are electronically grounded. Using an alternating voltage across light modulating layer 30 prevents the damage from migration of ions within and between any of the layers. A frequency of greater than 60 cycles per second in the alternating voltage is sufficient to orient molecules in the light modulating layer 30.

Figure 2A:
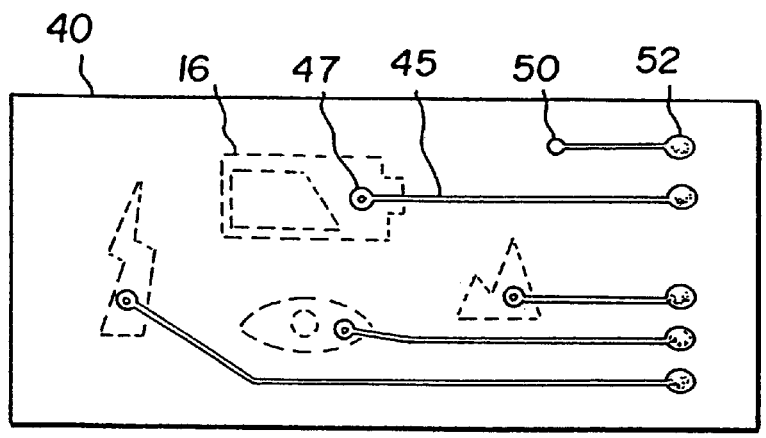
FIG. 2A and FIG. 2C is a top view of the circuit board of FIG. 1C that is part of the display.
Figure 2C:
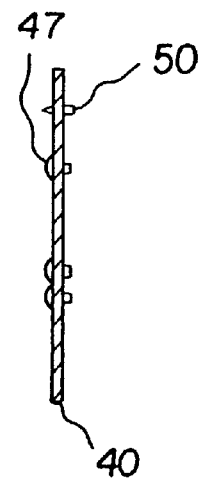
Figure 2B:
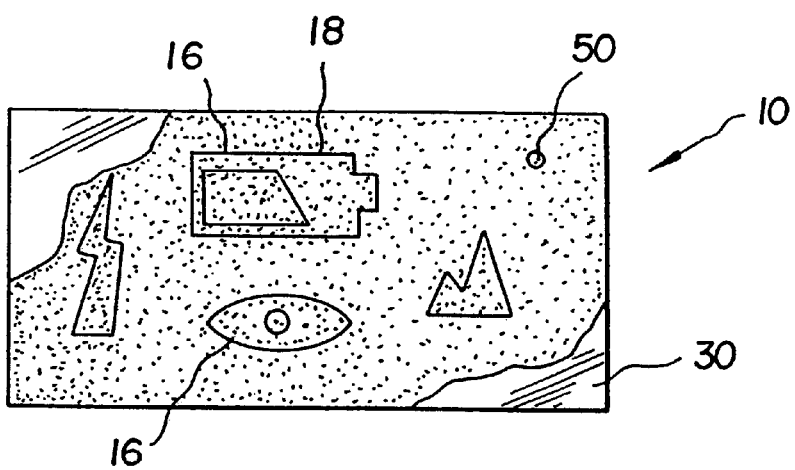
FIG. 2B is a top view with cut away sections of the processed sheet of FIG. 1B that is part of the display.

FIGS. 2A and 2B show top views of each of the two parts of display 5. It should be noted that the display 5 is a unitary structure. FIG. 2A shows a circuit board 40, which has circuit board traces 45 running from a position under each viewable and conductive image 16 to a connection point 52. Contact pads 47 are located under each viewable and conductive image 16 and are soldered to each conductive trace 45 to provide electrical interconnect to each viewable and conductive image 16 on sheet 10. FIG. 2B is a top view of sheet 10 with light modulating layer 30 sectioned away to show viewable and conductive images 16. The silver halide in the sheet 10 has been processed into black, conductive silver. Non-conductive areas 18 serve to delineate displayable areas. A power pin 50 penetrates a clear area in photosensitive layer 14 to contact the transparent, electrically conductive coating 13. Multiple power pins 50 can be used to ensure sufficient electrical power across the transparent, electrically conductive coating 13.

Figure 3A:
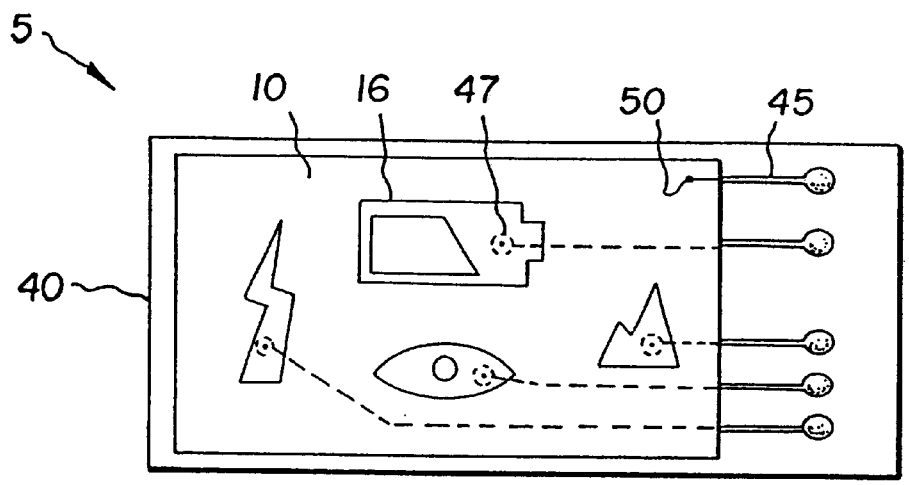
FIG. 3A is a top view of the completed display in an inactivated state.
Figure 3B:
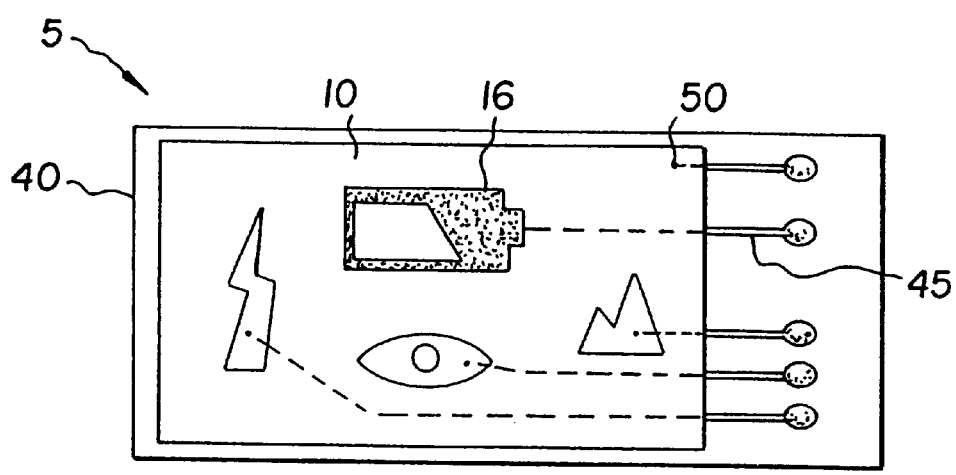
FIG. 3B is a top view of the completed display with an activated portion.

Top views of display 5 are shown in FIGS. 3A and 3B. Circuit board 40 has a series of circuit board traces 45 that provide interconnection to external drive electronics (not shown). Each circuit board trace 45 terminates under a separate viewable and conductive image 16. Contact pads 47 press against each viewable and conductive image 16.

In FIG. 3A, which shows an inactivated state, viewable and conductive images 16 are obscured by light modulating layer 30 which reflects light from absorption by the viewable and conductive images 16. Power pin 50 continuously supplies an alternating electrical voltage through a non-conductive area 18 in the photosensitive layer 14 to the transparent, electrically conductive coating 13. FIG. 3B shows the activation of one area of display 5. A circuit board trace 45 has a first electrical potential switched to ground. The circuit board trace 45 applies the ground potential to contact pad 47 (shown in FIG. 3A) and into viewable and conductive image 16. Power pin 50 supplies an alternating voltage to the transparent, electrically conductive coating 13 on the other side of light modulating layer 30.

Figure 4A:
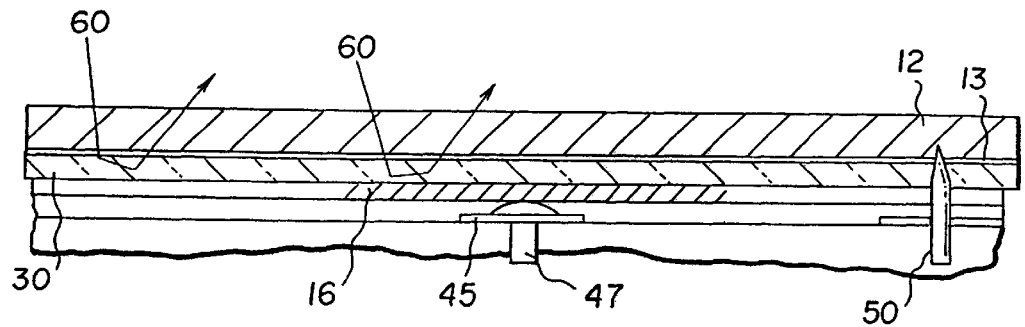
FIG. 4A is a sectional view showing light striking a viewable and conductive image.
Figure 4B:
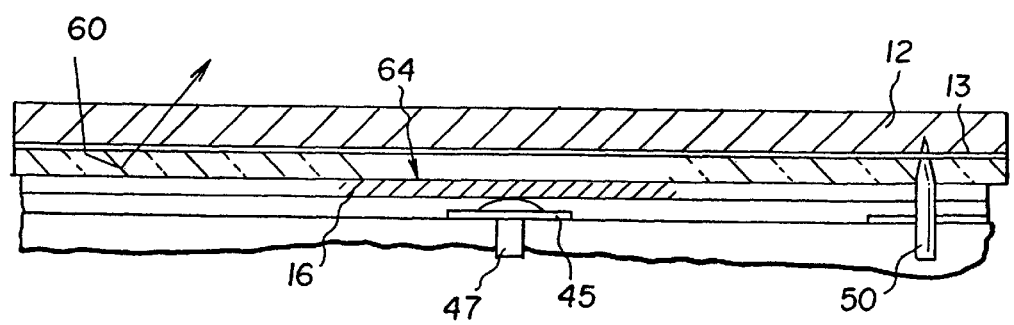
FIG. 4B is a sectional view showing the optical effect of an activated portion of the display.

FIGS. 4A and 4B are sectional views of the optical operation of display 5 in non-operating and operating modes, respectively. In both figures, an alternating voltage is supplied through power pin 50 to the transparent, electrically conductive coating 13. In FIG. 4A, viewable and conductive image 16 is not grounded and no voltage exists between viewable and conductive image 16 and the transparent, electrically conductive coating 13. Light modulating layer 30 reflects light striking display 5 back as reflected light 60. FIG. 4B shows the result of applying a ground to viewable and conductive image 16 through contact pad 47. The applied alternating voltage across light modulating layer 30 causes the liquid crystal material to align with the imposed electrical field. The area of light modulating layer 30 over viewable and conductive image 16 becomes transparent and viewable and conductive image 16 absorbs absorbed light 64. The black silver material from the processed photosensitive layer 14 absorbs any light in the viewable and conductive image 16, causing the displayed area to appear black in a normally white sheet.

Figure 5A:
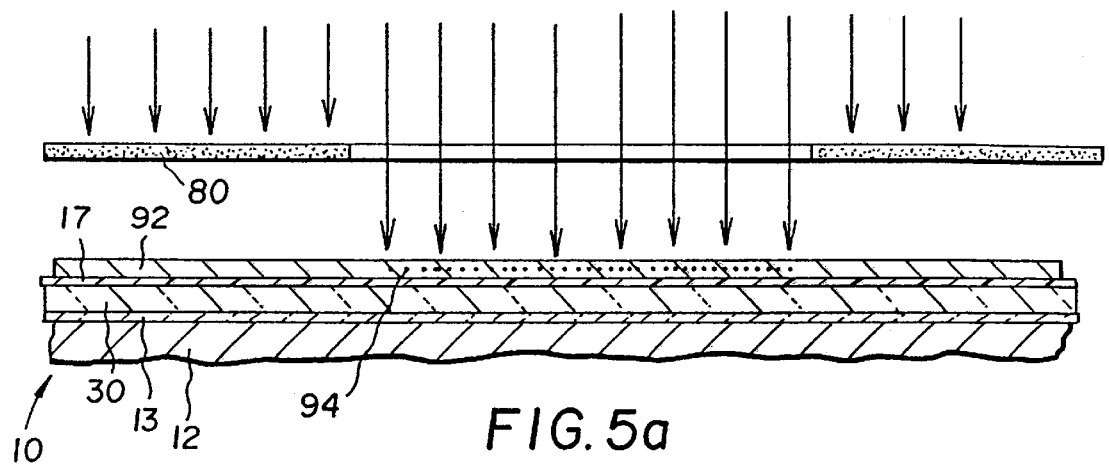
FIGS. 5A–5D show various steps in the formation of the viewable and conductive images of the sheet of FIG. 2B in accordance with the present invention.

FIGS. 5A–5E are schematic representations of how the viewable and conductive images 16 are formed in the photosensitive layer 14. In this embodiment, unexposed silver halide 92 is the light sensitive material of the photosensitive layer 14. In FIG. 5A, photo-mask 80 selectively blocks a source of light that strikes and exposes exposed silver halide 94 while unexposed silver halide 92 remains inactivated.

Figure 5B:
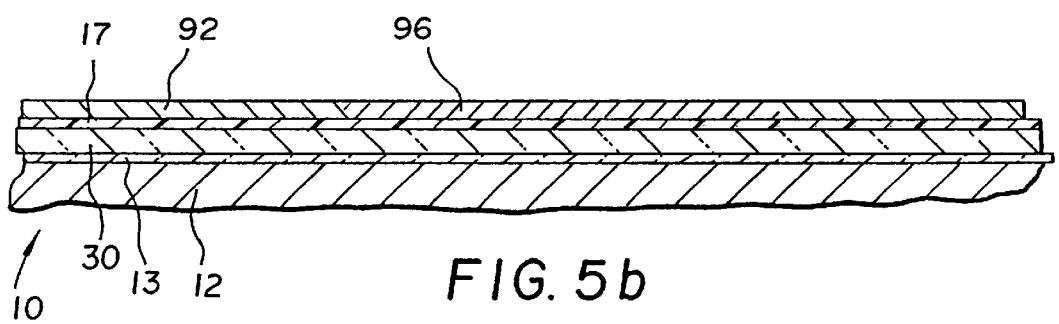

In FIG. 5B, sheet 10 has been photographically developed to convert exposed silver halide 94 to metallic silver 96. During the chemical development process, barrier layer 17 has prevented developing chemicals from contaminating light modulating layer 30. Metallic silver 96 forms the viewable and conductive images 16 in completed display 5.

Figure 5C:
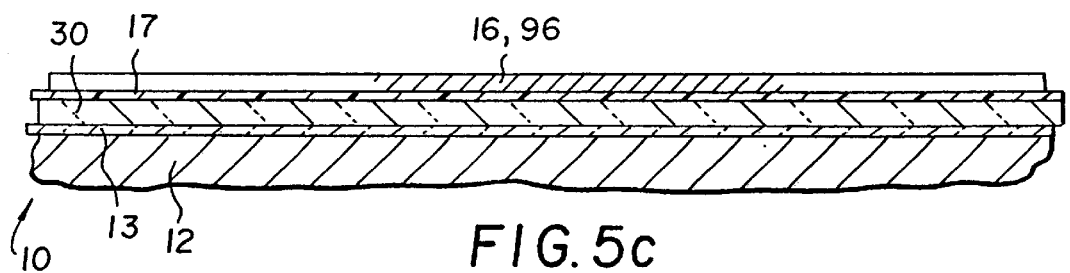

In FIG. 5C, a conventional photographic fixing step has removed the unexposed silver halide 92. Removal of unexposed silver halide 92 forms the non-conductive areas 18 in completed display 5.

Figure 5D:
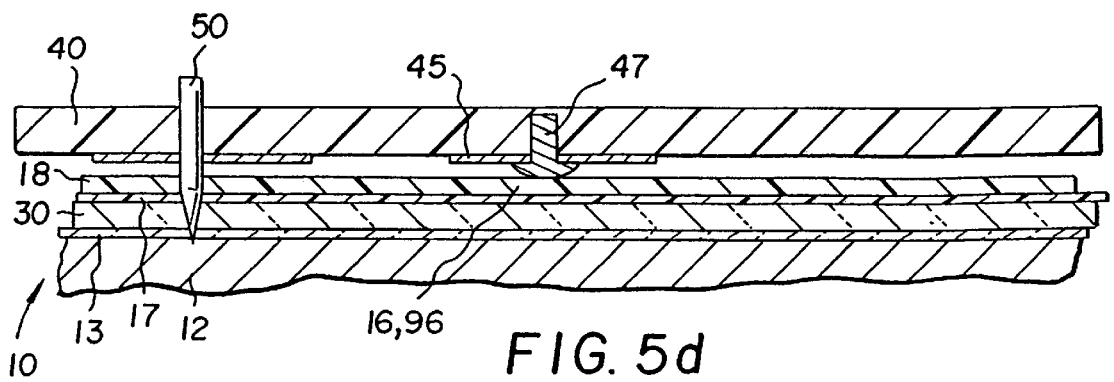

In FIG. 5D, circuit board 40 has been pressed against sheet 10. Contact pad 47 makes electrical connection with viewable and conductive images 16. Power pin 50 has penetrated through non-conductive area 18, barrier layer 17 and light modulating layer 30 to form electrical connection with the transparent, electrically conductive coating 13.

The invention has been described in detail with particular reference to certain preferred embodiments thereof, but it will be understood that variations and modifications can be effected within the spirit and scope of the invention.

PARTS LIST 5 display
10 sheet
12 substrate
13 transparent, electrically conductive coating
14 photosensitive layer
16 viewable and conductive images
17 barrier layer
18 non-conductive areas
30 light modulating layer
40 circuit board
45 circuit board traces
47 contact pad
50 power pin
52 connection point
60 reflected light
64 absorbed light
80 photo mask
80c photo-mask coating
92 unexposed silver halide 94 exposed silver halide
96 metallic silver

What is claimed is:

1. A display for presenting selected images to a viewer, comprising:
   (a) a transparent substrate;
   (b) a transparent, electrically conductive coating formed over the transparent substrate;
   (c) a light modulating layer formed over the transparent, electrically conductive layer;
   (d) a photosensitive layer formed over the light modulating layer which is adapted to be exposed and developed to provide viewable and conductive images;
   (e) the light modulating layer being effective in two conditions, in a first condition to prevent the viewing of the viewable and conductive images and in a second condition to permit the viewing of the viewable and conductive images; and
   (f) electrical conduction means connected to the viewable and conductive images and the transparent, electrically conductive coating for applying a field to selected ones of such viewable and conductive images to cause the light modulating layer to change from the first condition to the second condition so as to present such viewable and conductive images for viewing to the viewer.

2. The display according to claim 1 wherein the photosensitive layer includes silver halide and the viewable and conductive images are formed of developed silver.

3. The display according to claim 1 wherein the electrical conduction means includes a plurality of conductive pins which contact the viewable and conductive images to permit an electrical potential to be applied across a selected image and the conductive coating.

4. The display according to claim 1 wherein the display is a unitary structure.

5. The display according to claim 1 wherein the electrical conduction means includes at least one piercing pin to provide electrical contact to the transparent, electrically conductive coating.

6. The display according to claim 1 wherein the light modulating layer includes liquid crystal material in a gelatin matrix.

7. The display according to claim 1 wherein the transparent, electrically conductive coating includes Indium-Tin-Oxide.

8. The display according to claim 1 further including a barrier layer disposed between the light modulating layer and the photosensitive layer.

9. The display according to claim 8 wherein the barrier layer includes a highly cross-linked gelatin.

10. The display according to claim 1 further including non-conductive traces provided in the photosensitive layer.

11. The display according to claim 10 wherein the non-conductive traces have a width between 5 and 50 microns.

12. The display according to claim 1 wherein the electrical conduction means includes means for applying an alternating voltage to the transparent, electrically conductive coating and further including means for selectively applying a ground potential to each of the viewable and conductive images.

13. A method of forming a display in which images can be selectively presented to a viewer, comprising the steps of:
   (a) providing a transparent substrate;
   (b) forming a transparent, electrically conductive coating over the transparent substrate;
   (c) forming a light modulating layer including liquid crystal material in a gelatin over the transparent, electrically conductive layer to be effective in a first condition to prevent the viewing of viewable and conductive images and in a second condition to permit the viewing of viewable and conductive images;
   (d) forming a photosensitive layer including silver halide over the light modulating layer and exposing and developing such photosensitive layer to provide the viewable and conductive images; and
   (e) providing electrical connection so that an electrical field can be applied across selected ones of such viewable and conductive images and the transparent, electrically conductive layer to cause the light modulating layer to change from the first condition to the second condition so as to present such viewable and conductive images for viewing to the viewer.

14. The method according to claim 13 further including the step of forming a barrier layer between the light modulating layer and the photosensitive layer.

15. The method according to claim 13 wherein exposure and development of the photosensitive layer substantially converts all of the silver halide to metallic silver.

16. The method according to claim 13 wherein the step of forming the photosensitive layer includes providing non-conductive traces in the photosensitive layer.

* * * * *